United States Patent
Tsutsui et al.

(10) Patent No.: US 9,536,592 B2
(45) Date of Patent: Jan. 3, 2017

(54) MEMORY DEVICE AND SEMICONDUCTOR DEVICE

(71) Applicant: Semiconductor Energy Laboratory Co., Ltd., Atsugi-shi, Kanagawa-ken (JP)

(72) Inventors: Naoaki Tsutsui, Kanagawa (JP); Atsuo Isobe, Kanagawa (JP); Wataru Uesugi, Kanagawa (JP); Takuro Ohmaru, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/072,432

(22) Filed: Mar. 17, 2016

(65) Prior Publication Data

US 2016/0203852 A1  Jul. 14, 2016

Related U.S. Application Data

(63) Continuation of application No. 14/208,428, filed on Mar. 13, 2014, now Pat. No. 9,293,186.

(30) Foreign Application Priority Data

Mar. 14, 2013  (JP) .................. 2013-051966

(51) Int. Cl.
*G11C 11/24* (2006.01)
*G11C 11/4093* (2006.01)
(Continued)

(52) U.S. Cl.
CPC ............ *G11C 11/4093* (2013.01); *G11C 11/24* (2013.01); *G11C 11/401* (2013.01); *G11C 11/403* (2013.01)

(58) Field of Classification Search
CPC .................. G11C 11/24; G11C 11/401
(Continued)

(56) References Cited

U.S. PATENT DOCUMENTS 3,775,693 A  11/1973 Proebsting
4,797,576 A   1/1989 Asazawa
(Continued)

FOREIGN PATENT DOCUMENTS

EP  1737044 A  12/2006
EP  2226847 A   9/2010
(Continued)

OTHER PUBLICATIONS

Tomoaki Atsumi et al., DRAM Using Crystalline Oxide Semiconductor for Access Transistors and not Requiring Refresh for More Than Ten Days, IEEE , May 2012, Proc. 4th IEEE International Memory Workshop, May 2012, pp. 99-102.*

(Continued)

*Primary Examiner* — Hoai V Ho
*Assistant Examiner* — Jay Radke
(74) *Attorney, Agent, or Firm* — Fish & Richardson P.C.

(57) ABSTRACT

A memory device includes a first memory circuit including a silicon transistor, a selection circuit including a silicon transistor, and a second memory circuit including oxide semiconductor transistors and a storage capacitor, in which one terminal of the storage capacitor is connected to a portion where two oxide semiconductor transistors are connected in series, an output of the second memory circuit is connected to a second input terminal of the selection circuit, and an input of the second memory circuit is connected to a first input terminal of the selection circuit or an output terminal of the first memory circuit.

21 Claims, 9 Drawing Sheets

(51) Int. Cl.
*G11C 11/403* (2006.01)
*G11C 11/401* (2006.01)

(58) Field of Classification Search
USPC .............................. 365/149, 150, 182, 187
See application file for complete search history.

(56) References Cited

U.S. PATENT DOCUMENTS

| | | | |
|---|---|---|---|
| 4,800,303 A | 1/1989 | Graham et al. | |
| 5,007,022 A * | 4/1991 | Leigh | G11C 11/406 365/149 |
| 5,039,883 A | 8/1991 | On | |
| 5,136,533 A * | 8/1992 | Harari | G11C 8/16 257/300 |
| 5,420,824 A | 5/1995 | Kajimoto et al. | |
| 5,504,709 A * | 4/1996 | Yabe | G11C 7/1048 365/189.05 |
| 5,731,856 A | 3/1998 | Kim et al. | |
| 5,744,864 A | 4/1998 | Cillessen et al. | |
| 5,980,092 A | 11/1999 | Merryman et al. | |
| 6,049,883 A | 4/2000 | Tjandrasuwita | |
| 6,078,194 A | 6/2000 | Lee | |
| 6,204,695 B1 | 3/2001 | Alfke et al. | |
| 6,281,710 B1 | 8/2001 | Poirier et al. | |
| 6,294,274 B1 | 9/2001 | Kawazoe et al. | |
| 6,563,174 B2 | 5/2003 | Kawasaki et al. | |
| 6,573,754 B2 | 6/2003 | Menczigar et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,076,748 B2 | 7/2006 | Kapoor et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,576,582 B2 | 8/2009 | Lee et al. | |
| 7,674,650 B2 | 3/2010 | Akimoto et al. | |
| 7,732,819 B2 | 6/2010 | Akimoto et al. | |
| 8,410,838 B2 | 4/2013 | Kato et al. | |
| 8,467,231 B2 | 6/2013 | Matsuzaki et al. | |
| 8,860,485 B2 | 10/2014 | Kato et al. | |
| 9,350,334 B2 | 5/2016 | Kato et al. | |
| 2001/0046027 A1 | 11/2001 | Tai et al. | |
| 2002/0036529 A1 | 3/2002 | Furusawa et al. | |
| 2002/0056838 A1 | 5/2002 | Ogawa | |
| 2002/0074568 A1 | 6/2002 | Yoshida et al. | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0080999 A1 | 4/2004 | Madurawe | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0038582 A1 | 2/2006 | Peeters | |
| 2006/0043377 A1 | 3/2006 | Hoffman et al. | |
| 2006/0091793 A1 | 5/2006 | Baude et al. | |
| 2006/0095975 A1 | 5/2006 | Yamada et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1 | 6/2006 | Dronavalli | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0268632 A1 * | 11/2006 | Schnell | G01R 31/3016 365/194 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0008776 A1 | 1/2007 | Scheuerlein | |
| 2007/0024187 A1 | 2/2007 | Shin et al. | |
| 2007/0024318 A1 | 2/2007 | Mamidipaka | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048744 A1 | 2/2008 | Fukuoka | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0102018 A1 | 5/2011 | Shionoiri et al. | |
| 2011/0121878 A1 | 5/2011 | Kato et al. | |
| 2011/0187410 A1 | 8/2011 | Kato et al. | |
| 2012/0250397 A1 | 10/2012 | Ohmaru | |
| 2016/0226471 A1 | 8/2016 | Kato et al. | |

FOREIGN PATENT DOCUMENTS

| | | |
|---|---|---|
| EP | 2887395 A | 6/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| | | |
|---|---|---|
| JP | 08-264794 A | 10/1996 |
| JP | 10-078836 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-216340 A | 8/2005 |
| JP | 2011-129896 A | 6/2011 |
| JP | 2012-257200 A | 12/2012 |
| WO | WO-2004/114391 | 12/2004 |
| WO | WO-2011/062075 | 5/2011 |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1: Polarizer-Free Reflective LCD Combined with Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Informaiton Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-1652002-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, 2317, ECS.

Kimizuka.N et al., "Spinel,YbFe2O4, and Yb2Fe3O7 Types of Structures for Compounds in the In2O3 and Sc2O3—A2O3—BO Systesms [A; Fe, Ga, or Al; B: Mg, Mn, Fe, Ni, Cu,or Zn] at Temperature Over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-042201-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digets of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Paperes, 2007, vol. 38, pp. 1673-1676.

Mo.Y et al., "Amorphous Oxide TFT Backplanes for Large Size AMOLED Displays", IDW'08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector with Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTS with a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-in. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous Gizo (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

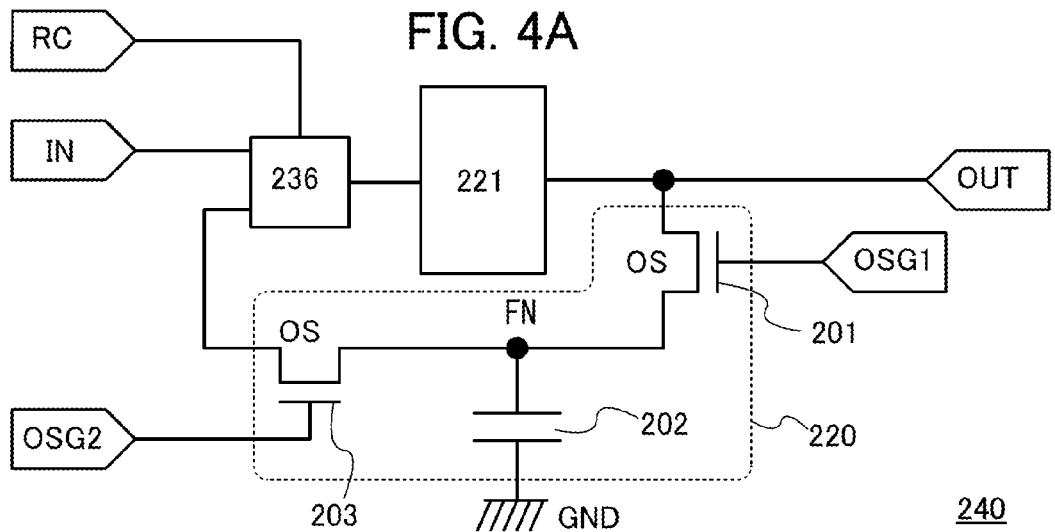
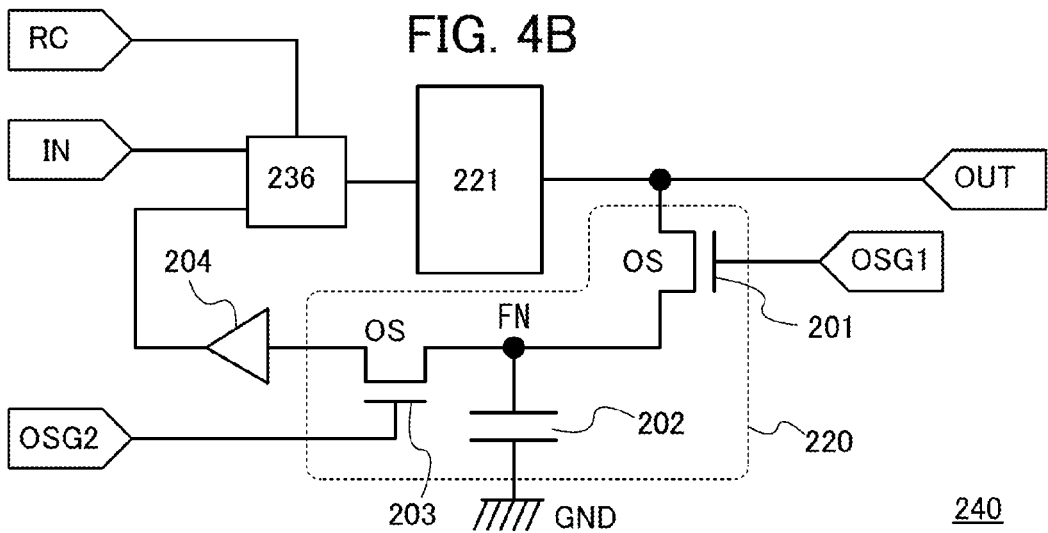
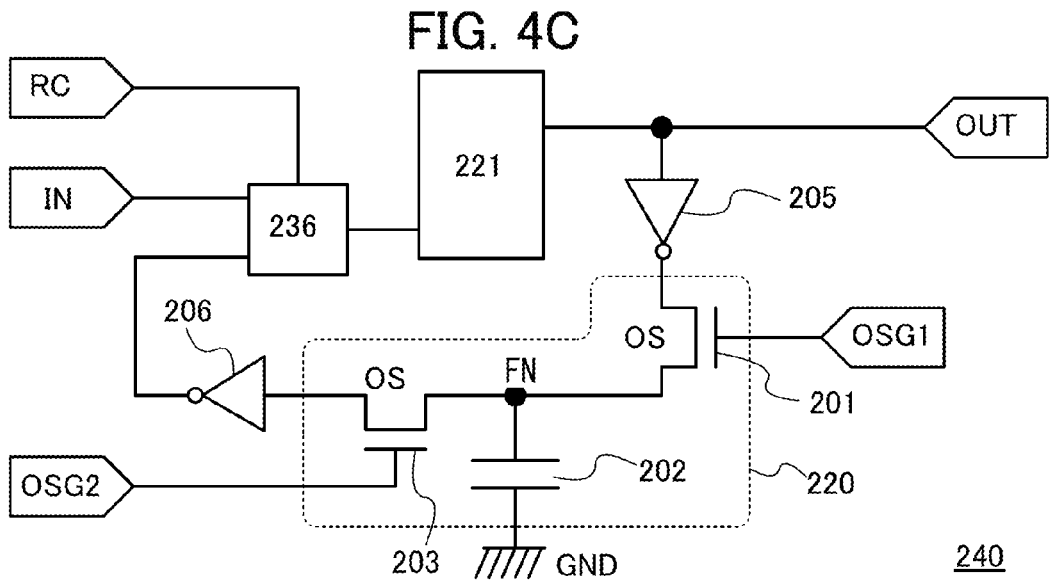

US 9,536,592 B2

MEMORY DEVICE AND SEMICONDUCTOR DEVICE

CROSS-REFERENCE TO RELATED APPLICATIONS

This application is a continuation of U.S. application Ser. No. 14/208,428, filed Mar. 13, 2014, now allowed, which claims the benefit of a foreign priority application filed in Japan as Serial No. 2013-051966 on Mar. 14, 2013, both of which are incorporated by reference.

BACKGROUND OF THE INVENTION

1. Field of the Invention

The present invention relates to an object, a method, or a manufacturing method. Further, the present invention relates to a process, a machine, manufacture, or a composition of matter. For example, in this specification, a semiconductor device, a display device, a power storage device, driving methods thereof, and manufacturing methods thereof are described. In this specification, as the semiconductor device, for example, a memory circuit, a processor including a memory circuit (typically, a programmable logic device, a CPU, or a microcontroller), and an electronic device including the processor are described.

Note that in this specification, a semiconductor device means a device including a circuit having a semiconductor element (e.g., a transistor or a diode). Alternatively, the semiconductor device means any device that can function by utilizing semiconductor characteristics. For example, an integrated circuit, a chip including an integrated circuit, a display device, a light-emitting device, and an electronic device are included in a semiconductor device or include a semiconductor device in some cases.

2. Description of the Related Art

Signal processing units such as central processing units (CPUs) vary in structure depending on the intended use. A signal processing unit generally has main memory for storing data or programs and other memory circuits such as a register and cache memory. A register has a function of temporarily maintaining a data signal for holding arithmetic processing or a program execution state, for example. Meanwhile, cache memory is located between an arithmetic unit and main memory in order to reduce access to the slow main memory and speed up arithmetic processing.

In a memory circuit such as a register or cache memory in a signal processing unit, writing of a data signal needs to be performed at higher speed than in main memory. Thus, in general, a flip-flop is used as a register, and static random access memory (SRAM) or the like is used as cache memory. In other words, such a register, cache memory, or the like is a volatile memory circuit, which loses a data signal after the application of power supply voltage is stopped.

There has been suggested a method for reducing power consumption by temporarily stopping the application of power supply voltage to a signal processing unit in a period during which a data signal is not input or output (e.g., see Patent Document 1). With the method in Patent Document 1, a nonvolatile memory circuit is located around a volatile memory circuit such as a register or cache memory, and the data signal is temporarily stored in the nonvolatile memory circuit. Thus, in the signal processing unit, the data signal stored in the register, the cache memory, or the like can be held even while the application of power supply voltage is stopped.

When the application of power supply voltage to a signal processing unit is stopped for a long time, a data signal in a volatile memory circuit is transferred to an external memory circuit such as a hard disk or flash memory before the application of power supply voltage is stopped, so that the data signal can be prevented from being lost.

However, the method in which a data signal that has been held in a volatile memory circuit is stored in a nonvolatile memory circuit located around the volatile memory circuit while the application of power supply voltage to a signal processing unit is stopped involves a complicated process of manufacturing the signal processing unit. This is because a magnetic element or a ferroelectric is mainly used for the nonvolatile memory circuit.

With the method in which a data signal that has been held in a volatile memory circuit is stored in an external memory circuit while the application of power supply voltage to a signal processing unit is stopped, it takes a long time to send back the data signal from the external memory circuit to the volatile memory circuit. Thus, backing up a data signal to an external memory circuit is not suitable for the case where the application of power supply voltage is stopped for a short time, during which a data signal is not input or output, in order to reduce power consumption.

In view of the above, Patent Document 2 suggests a memory device 140 (FIG. 9) in which a transistor whose off leakage current is extremely low (e.g., a transistor using an oxide semiconductor for a channel formation region) and a storage capacitor are used instead of the above nonvolatile memory circuit. The memory device 140 in FIG. 9 includes a memory circuit 121 including a transistor in which a channel formation region is formed in silicon (hereinafter referred to as Si transistor), a selection circuit 136 including a Si transistor, a transistor 101 in which an oxide semiconductor is used for a channel formation region (such a transistor is hereinafter referred to as OS transistor), and a storage capacitor 102. The memory device 140 is configured to hold a signal stored in the storage capacitor 102 during power interruption by utilizing the fact that the off leakage current of the OS transistor 101 is extremely low.

By employing this structure, it is possible to provide a memory device that does not need a complicated manufacturing process and has lower power consumption, and specifically a memory device that can reduce power consumption by stopping the application of power supply voltage even for a short time. Such a memory device has the advantage of no performance degradation due to data rewriting because it uses the OS transistor and the storage capacitor instead of a nonvolatile memory circuit.

REFERENCE

Patent Document 1: Japanese Published Patent Application No. H10-078836
Patent Document 2: Japanese Published Patent Application No. 2012-257200

SUMMARY OF THE INVENTION

Although a gate of the Si transistor is connected to an input terminal of the selection circuit connected to the storage capacitor in the structure of FIG. 9, a source or a drain of the Si transistor may alternatively be connected to the input terminal of the selection circuit depending on the design of the selection circuit. In addition, the structure in FIG. 9 is based on the assumption that the gate leakage current of the Si transistor is sufficiently low; however, design rules for LSI circuits are getting finer and as a result, the gate leakage current of transistors is becoming too high to ignore during the design phase. Thus, it is becoming difficult to maintain data for a sufficiently long time with the structure in FIG. 9.

In view of the foregoing problems, an object of one embodiment of the disclosed invention is to provide a memory device that does not need a complicated manufacturing process and has lower power consumption. Another object is to provide a memory device that can have lower power consumption even by stopping the application of power supply voltage for a short time, and specifically a memory device that can have lower power consumption by stopping the application of power supply voltage even when gate leakage is large because of miniaturization of a Si transistor.

In order to achieve any of the above objects, one embodiment of the present invention uses a memory circuit including a first transistor, a second transistor, and a storage capacitor. One terminal of the storage capacitor is electrically connected to one of a source and a drain of the first transistor and one of a source and a drain of the second transistor. The first and second transistors are transistors with very low off leakage current, for example, transistors using an oxide semiconductor for a channel formation region (OS transistors). Since the off leakage current of the OS transistor is extremely low, a signal held in the storage capacitor can be maintained for a long time. In addition, the memory circuit using the OS transistors as the first and second transistors has the advantage of no performance degradation due to data rewriting.

One embodiment of the present invention includes a first memory circuit, a selection circuit, and a second memory circuit. The first memory circuit includes a first transistor, a second transistor, and a storage capacitor. One terminal of the storage capacitor is electrically connected to one of a source and a drain of the first transistor and one of a source and a drain of the second transistor. The first and second transistors are transistors with very low off leakage current, for example, transistors using an oxide semiconductor for a channel formation region (OS transistors). Since the off leakage current of the OS transistor is extremely low, a signal held in the storage capacitor can be maintained for a long time. The other of the source and the drain of the second transistor is electrically connected to a second input terminal of the selection circuit. An output terminal of the selection circuit is electrically connected to an input terminal of the second memory circuit. The other of the source and the drain of the first transistor is electrically connected to a first input terminal of the selection circuit or an output terminal of the second memory circuit.

The other of the source and the drain of the second transistor may be electrically connected to the second input terminal of the selection circuit through a buffer circuit. If the voltage of the signal held in the storage capacitor is lowered while the application of power supply voltage is stopped, the loss of the voltage can be compensated owing to the buffer circuit at the time of signal output and a proper voltage can be output as a result. When the buffer circuit is provided so that the loss of the voltage can be compensated, the guaranteed operating range of the memory device can be expanded.

It is possible that the other of the source and the drain of the first transistor is electrically connected to the first input terminal of the selection circuit or the output terminal of the second memory circuit through an inverter circuit, and that the other of the source and the drain of the second transistor is electrically connected to the second input terminal of the selection circuit through another inverter circuit. If the voltage of the signal held in the storage capacitor is lowered while the application of power supply voltage is stopped, the loss of the voltage can be compensated owing to the inverter circuits at the time of signal output and a proper voltage can be output as a result. When the inverter circuits are provided so that the loss of the voltage can be compensated, the guaranteed operating range of the memory device can be expanded.

The second memory circuit may be a latch circuit or a flip-flop circuit.

The second memory circuit and the selection circuit include a third transistor and a fourth transistor, respectively. The third and fourth transistors are transistors using Si for a channel formation region, for example.

According to one embodiment of the disclosed invention, it is possible to provide a lower-power memory device that does not need a complicated manufacturing process. Moreover, it is possible to provide a memory device that can reduce power consumption by stopping the application of power supply voltage even for a short time. Power consumption is effectively reduced particularly when the gate leakage is large because of miniaturization of a Si transistor.

BRIEF DESCRIPTION OF THE DRAWINGS

In the accompanying drawings,

FIGS. 4A to 4C are circuit diagrams of a memory device of an embodiment;

DETAILED DESCRIPTION OF THE INVENTION

Figure 1:
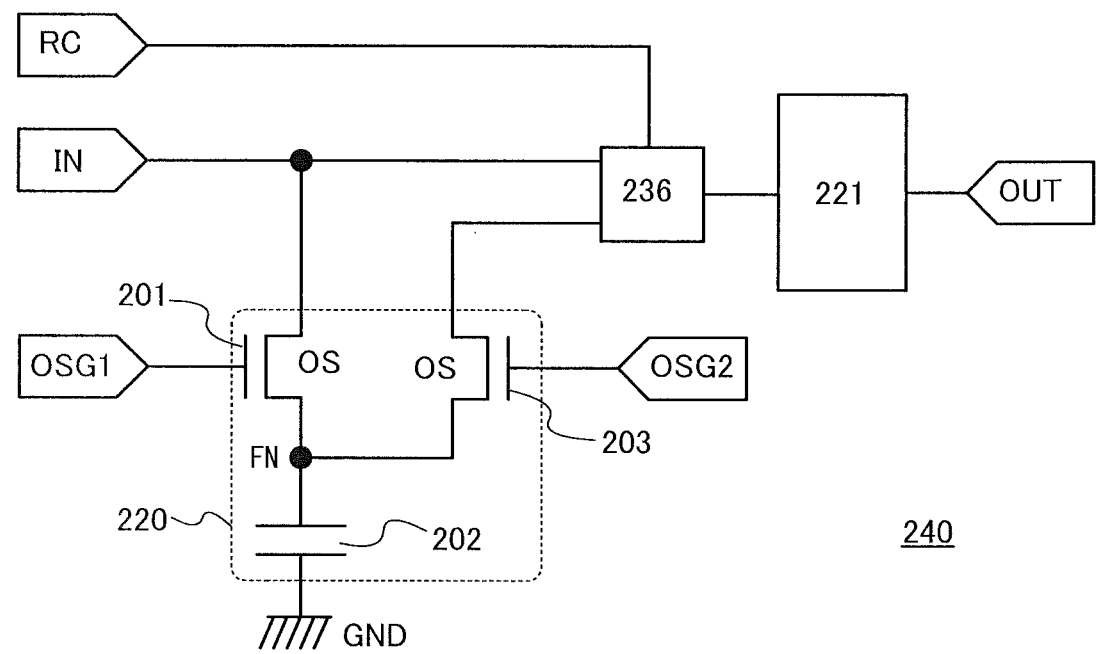
FIG. 1 is a circuit diagram of a memory device of an embodiment.

Embodiments of the invention disclosed in this specification will be hereinafter described with reference to the accompanying drawings. Note that the invention disclosed in this specification can be carried out in a variety of different modes, and it is easily understood by those skilled in the art that the modes and details of the disclosed invention can be changed in various ways without departing from the spirit and scope thereof. Therefore, the disclosed invention is not interpreted as being limited to the description of the following embodiments. In the drawings, the same portions or portions having similar functions are denoted by common reference numerals, and the description thereof is not repeated.

Note that the position, size, range, or the like of each component illustrated in the drawings and the like is not accurately represented in some cases for easy understanding. Therefore, the disclosed invention is not necessarily limited to the position, size, range, or the like disclosed in the drawings and the like.

In this specification and the like, ordinal numbers such as first, second, and third are used in order to avoid confusion among components, and the terms do not mean limitation of the number of components. Note that a voltage indicates a potential difference between one potential and a reference potential (e.g., a ground potential) in many cases. Therefore, voltage, potential and potential difference can be referred to as potential, voltage, and voltage difference, respectively.

Note that when it is explicitly described that "A and B are connected", the case where A and B are electrically connected, the case where A and B are functionally connected, and the case where A and B are directly connected are included therein.

In this specification, the on state of a transistor means that electrical continuity is established between its source and drain, whereas the off state of a transistor means that electrical continuity between its source and drain is not made.

Embodiment 1

Structure of Memory Device in FIG. 1

In Embodiment 1, the structure of a memory device of one embodiment of the present invention will be described with reference to FIG. 1.

A memory device 240 illustrated in FIG. 1 includes a memory circuit 220 including a first transistor 201, a second transistor 203, and a storage capacitor 202; a memory circuit 221 including a third transistor; and a selection circuit (also referred to as multiplexer) 236 including a fourth transistor.

As the first transistor 201 and the second transistor 203, a transistor using an oxide semiconductor for a channel formation region (OS transistor) is used, for example. Because of their very low off leakage current, the OS transistors can form the memory circuit 220 in which a signal stored in the storage capacitor 202 can be held during power interruption. The memory circuit 220 including the OS transistors as the first transistor 201 and the second transistor 203 has the advantage of no performance degradation due to data rewriting. The oxide semiconductor will be described later.

As the third transistor and the fourth transistor, a transistor using silicon for a channel formation region is used, for example. Although silicon can be single crystal silicon or polycrystalline silicon, a transistor whose channel is formed in single crystal silicon is preferable because it is driven at high frequency. Alternatively, a semiconductor such as Ge or SiC or a compound semiconductor such as GaAs or GaP may be used instead of Si.

In the memory circuit 220, one terminal of the storage capacitor 202 is electrically connected to one of a source and a drain of the first transistor 201 and one of a source and a drain of the second transistor 203. A low potential (e.g., a ground potential GND) is input to the other terminal of the storage capacitor 202. Note that a portion where one of the source and the drain of the first transistor 201, one of the source and the drain of the second transistor 203, and the storage capacitor 202 are connected is referred to as a node FN.

A control signal OSG1 is input to a gate of the first transistor 201. A control signal OSG2 is input to a gate of the second transistor 203.

The other of the source and the drain of the first transistor 201 is electrically connected to a first input terminal of the selection circuit 236. The other of the source and the drain of the second transistor 203 is electrically connected to a second input terminal of the selection circuit 236. An output terminal of the selection circuit 236 is electrically connected to an input terminal of the memory circuit 221.

The selection circuit 236 selects one of two inputted signals in response to a selection signal RC and outputs the selected signal.

An input signal IN is input to the first input terminal of the selection circuit 236. The input signal IN is transmitted through the selection circuit 236 and stored in the memory circuit 221. The memory circuit 221 is a volatile memory circuit that can hold a data signal only while power supply voltage Vx (not illustrated) is applied. Specifically, the memory circuit 221 can be a latch circuit or a flip-flop which includes the third transistor, for example.

<Method for Driving Memory Device>

Figure 2:
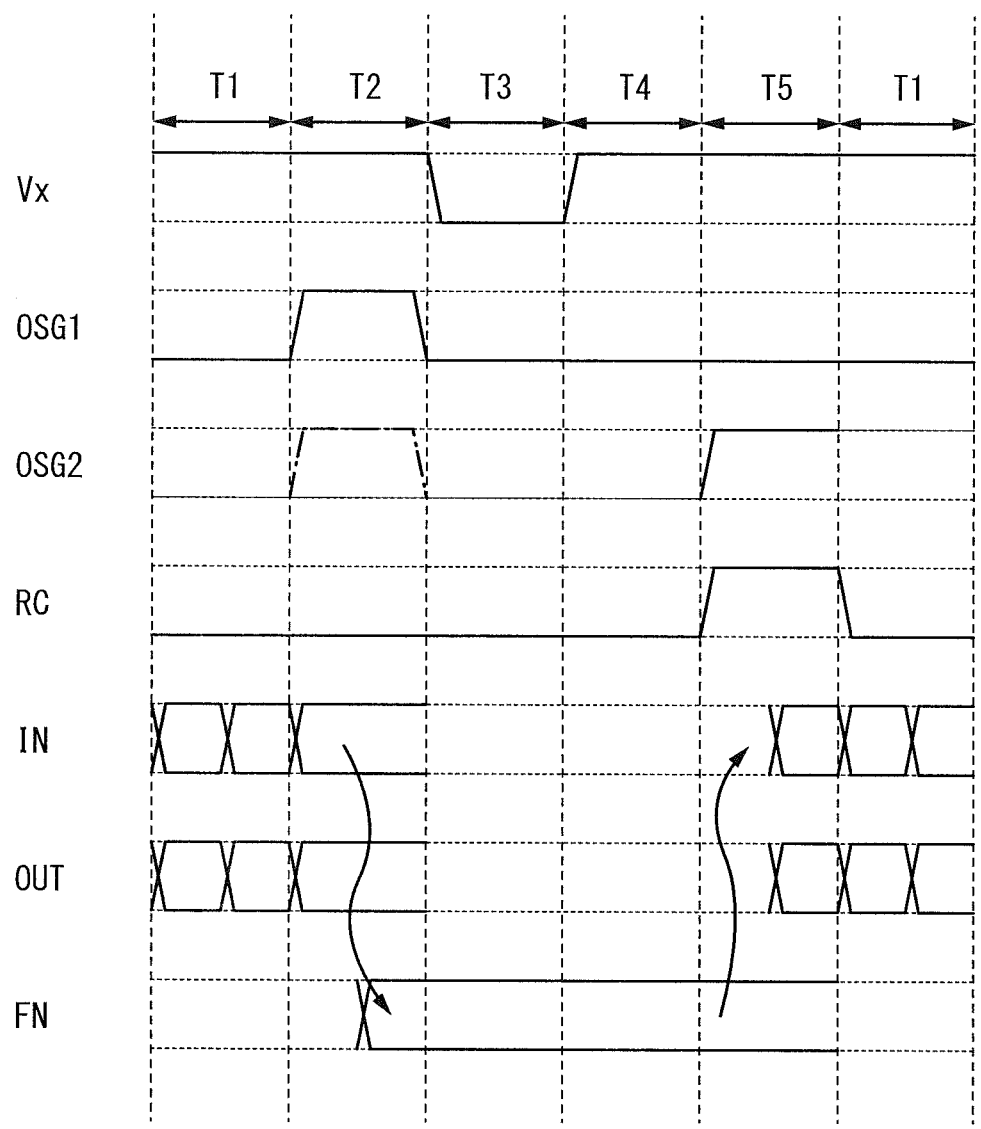
FIG. 2 is a timing chart illustrating the operation of a memory device of an embodiment.

FIG. 2 is a timing chart of driving of the memory device 240 illustrated in FIG. 1.

<Normal Operation Period (Period T1)>

A period T1 is a period during which the memory device 240 operates normally.

In the period T1, the input signal IN is input to the memory circuit 221 through the selection circuit 236 and held in the memory circuit 221.

In the period T1, the control signal OSG1 for turning off the first transistor 201 is preferably input to the gate of the first transistor 201, in which case the storage capacitor 202 does not act as a load, so that the memory device 240 can operate at high speed and power consumption can be reduced.

In the period T1, the potential of the node FN can be floating. A signal from the node FN is not transmitted to the memory circuit 221 because of the selection circuit 236.

<Writing Operation Period (Period T2)>

A period T2 is a period during which the input signal IN is written into the memory circuit 220. The period T2 is a period before the after-mentioned period T3 (a period during which the application of power supply voltage is stopped). That is, the input signal IN is written into the memory circuit 220 before the application of the power supply voltage Vx is stopped.

At the beginning of the period T2, the control signal OSG1 for controlling the first transistor 201 has a voltage high enough to enable writing of the input signal IN into the storage capacitor 202, and the voltage is applied to the gate of the first transistor 201; thus, electrical continuity is established between the source and the drain of the first transistor 201 (the first transistor 201 is turned on). Accordingly, the input signal IN is input to the storage capacitor 202 through the first transistor 201 and held in the storage capacitor 202. At this time, when the subsequent period during which the application of the power supply voltage Vx is stopped is short, the second transistor 203 is preferably on. This is because by making a node between the second transistor 203 and the selection circuit 236 have the same potential as the input signal IN, the operation speed of the memory device 240 can be increased and frequent power on/off can be efficiently performed. On the other hand, when the subsequent period during which the application of the power supply voltage Vx is stopped is long, the second transistor 203 may be on or off. Since the off leakage current of the first transistor 201 and the second transistor 203 is extremely low, the signal held in the storage capacitor 202 can be maintained for a sufficiently long time even when the period during which the application of the power supply voltage Vx is stopped is long. The voltage high enough to enable writing of the data signal into the storage capacitor 202 can be a high-level potential (VDD) or a potential other than the high-level potential (VDD).

<Power Supply Voltage Stop Period (Period T3)>

The period T3 is a period during which the application of power supply voltage is stopped. At the beginning of the period T3, the application of the power supply voltage Vx to the memory device 240 is stopped. Further, the control signal OSG1 for controlling the first transistor 201 is set to a low-level potential (VSS); thus, the first transistor 201 is turned off. When the application of the power supply voltage Vx is stopped, the data stored in the memory circuit 221 is lost. However, the input signal IN stored in the storage capacitor 202 is held even after the application of the power supply voltage Vx to the memory circuit 221 is stopped. Since the off leakage current of the first transistor 201 and the second transistor 203, which are connected to the storage capacitor 202, is extremely low, the input signal IN held in the storage capacitor 202 can be maintained for a long time. Consequently, the input signal IN is maintained in the memory device 240 even after the application of the power supply voltage Vx is stopped. The period T3 corresponds to a period during which the power supply voltage Vx is not supplied to the memory device 240.

Since the off leakage current of the first transistor 201 and the second transistor 203 is extremely low as described above, the input signal IN held by the storage capacitor 202 can be maintained for a long time.

<Power Supply Voltage Resumption Period (Period T4)>

A period T4 is a period during which the application of the power supply voltage Vx is resumed. At the beginning of the period T4, the application of the power supply voltage Vx to the memory device 240 is resumed. At this time, the control signals OSG1 and OSG2 for controlling the first transistor 201 and the second transistor 203 have the low-level potential (VSS), so that the first transistor 201 and the second transistor 203 remain off. Thus, the input signal IN is kept in the storage capacitor 202.

<Reading Operation Period (Period T5)>

A period T5 is a period during which the input signal IN written into the memory circuit 220 is read. At the beginning of the period T5, the selection signal RC and the control signal OSG2 for controlling the second transistor 203 are changed from the low-level potential (VSS) to the high-level potential (VDD). The selection signal RC having the high-level potential (VDD) is input to the selection circuit 236, the high-level potential (VDD) is input to the second transistor 203, and the input signal IN held in the storage capacitor 202 is input to the memory circuit 221. The input signal IN input to the memory circuit 221 is output as an output signal OUT.

After the period T5, which is the reading operation period, another period T1 (normal operation period) starts, and a new input signal IN is input to the memory device 240.

As described above, in the driving of the memory device 240, the high-level potential (VDD) is input to the gate of the first transistor 201 in the period T2 (writing operation period), so that the input signal IN is transmitted through the first transistor 201 and stored in the storage capacitor 202.

The storage capacitor 202 is connected to the first transistor 201 and the second transistor 203 but not directly connected to a gate of the third transistor or the fourth transistor. Accordingly, even if the gate leakage current of the third transistor or the fourth transistor is high, the input signal IN held by the storage capacitor 202 can be maintained for a long time because the off leakage current of the first transistor 201 and the second transistor 203 is extremely low.

Accordingly, it is possible to provide a memory device that can maintain an input signal even while the application of power supply voltage is stopped for a long time and can reduce power consumption by stopping the application of power supply voltage even for a short time. Power consumption is effectively reduced particularly when the gate leakage is large because of miniaturization of the Si transistor.

This embodiment can be combined with any of the other embodiments in this specification as appropriate.

Embodiment 2

In Embodiment 2, the structures of a memory device of one embodiment of the present invention that are different from the structure of the memory device in FIG. 1 will be described with reference to FIGS. 3A and 3B.

Figure 3A:
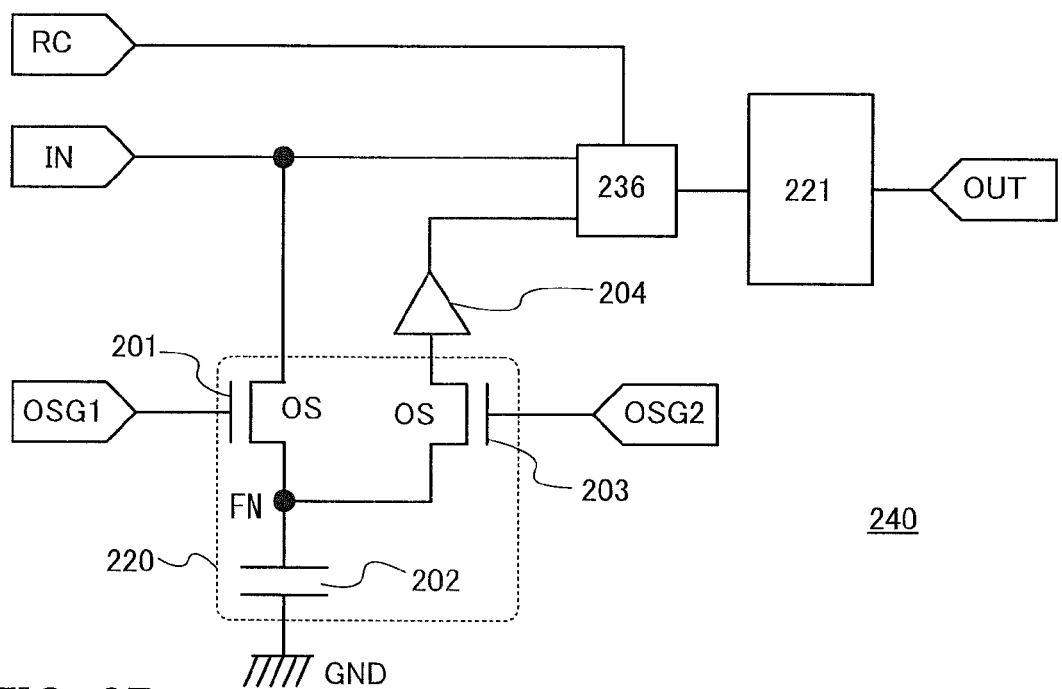
FIGS. 3A and 3B are circuit diagrams of a memory device of an embodiment.

FIG. 3A illustrates a structure where a buffer circuit 204 is provided between the other of the source and the drain of the second transistor 203 and the selection circuit 236. The other components are the same as in Embodiment 1. If the voltage of the input signal IN held in the storage capacitor 202 is lowered in the power supply voltage stop period, the loss of the voltage can be compensated owing to the buffer circuit 204 at the time of outputting the signal of the node FN and a proper voltage can be output as a result. When the loss of the voltage can be compensated by providing the buffer circuit 204, the guaranteed operating range of the memory device 240 can be expanded.

Figure 3B:
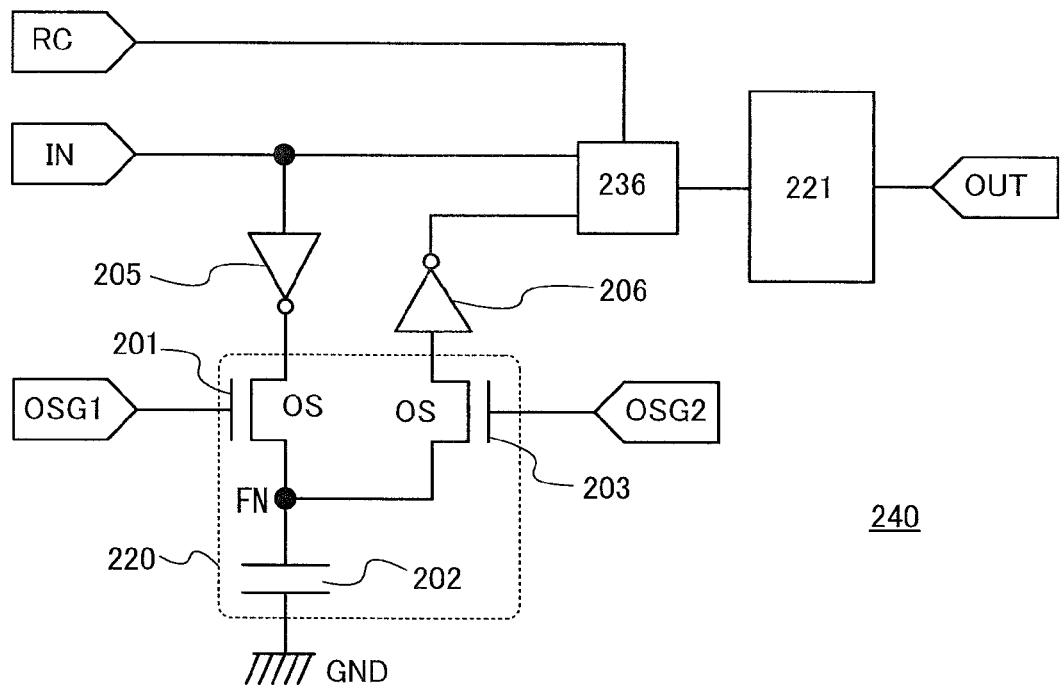

FIG. 3B illustrates a structure where an inverter circuit 205 is provided between the other of the source and the drain of the first transistor 201 and the selection circuit 236 and an inverter circuit 206 is provided between the other of the source and the drain of the second transistor 203 and the selection circuit 236. The other components are the same as in Embodiment 1. If the voltage of the input signal IN held in the storage capacitor 202 is lowered in the power supply voltage stop period, the loss of the voltage can be compensated at the time of outputting the signal of the node FN and the voltage can be output as a proper voltage as in the case of providing the buffer circuit 204 illustrated in FIG. 3A. When the loss of the voltage can be compensated by providing the inverter circuits 205 and 206, the guaranteed operating range of the memory device 240 can be expanded.

This embodiment can be combined with any of the other embodiments in this specification as appropriate.

Embodiment 3

In Embodiment 3, the structures of a memory device of one embodiment of the present invention that are different from those of the memory devices in FIG. 1 and FIGS. 3A and 3B will be described with reference to FIGS. 4A to 4C and FIGS. 5A to 5C.

In FIG. 4A, the other of the source and the drain of the first transistor 201 is electrically connected to the output terminal of the memory circuit 221. The other components are the same as in Embodiment 1. Note that the memory circuit 221 in FIG. 4A is configured so that a potential having the same level as the potential of the input signal IN input to the input terminal of the memory circuit 221 is output to the output terminal as the output signal OUT.

The storage capacitor 202 is connected to the first transistor 201 and the second transistor 203 but not directly connected to the gate of the third transistor or the fourth transistor. Accordingly, even if the gate leakage current of the third transistor or the fourth transistor is high, the output signal OUT held by the storage capacitor 202 can be maintained for a long time because the off leakage current of the first transistor 201 and the second transistor 203 is extremely low.

FIG. 4B illustrates a structure where the buffer circuit 204 is provided between the other of the source and the drain of the second transistor 203 and the selection circuit 236. The other components are the same as in FIG. 4A. If the voltage of the output signal OUT held in the storage capacitor 202 is lowered in the power supply voltage stop period, the loss of the voltage can be compensated owing to the buffer circuit 204 at the time of outputting the signal of the node FN and a proper voltage can be output as a result. When the loss of the voltage can be compensated by providing the buffer circuit 204, the guaranteed operating range of the memory device 240 can be expanded.

FIG. 4C illustrates a structure where the inverter circuit 205 is provided between the other of the source and the drain of the first transistor 201 and the memory circuit 221 and the inverter circuit 206 is provided between the other of the source and the drain of the second transistor 203 and the selection circuit 236. The other components are the same as in FIG. 4A. If the voltage of the output signal OUT held in the storage capacitor 202 is lowered in the power supply voltage stop period, the loss of the voltage can be compensated at the time of outputting the signal of the node FN and the voltage can be output as a proper voltage as in the case of providing the buffer circuit 204 illustrated in FIG. 4B. When the loss of the voltage can be compensated by providing the inverter circuits 205 and 206, the guaranteed operating range of the memory device 240 can be expanded.

Figure 5A:
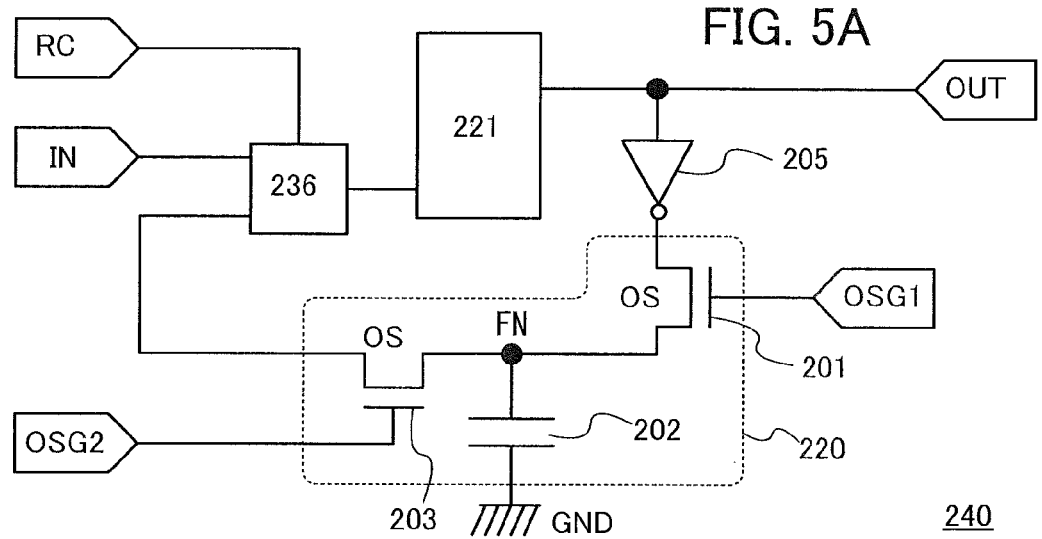
FIGS. 5A to 5C are circuit diagrams of a memory device of an embodiment.

In FIG. 5A, the other of the source and the drain of the first transistor 201 is electrically connected to the output terminal of the memory circuit 221 through the inverter circuit 205. The other components are the same as in Embodiment 1. Note that the memory circuit 221 in FIG. 5A is configured so that a potential having a level different from that of the potential of the input signal IN input to the input terminal of the memory circuit 221 (i.e., a potential that has a low level when the input signal IN has a high-level potential and has a high level when the input signal IN has a low-level potential) is output to the output terminal as the output signal OUT.

The storage capacitor 202 is connected to the first transistor 201 and the second transistor 203 but not directly connected to the gate of the third transistor or the fourth transistor. Accordingly, even if the gate leakage current of the third transistor or the fourth transistor is high, the output signal OUT held by the storage capacitor 202 can be maintained for a long time because the off leakage current of the first transistor 201 and the second transistor 203 is extremely low.

Figure 5B:
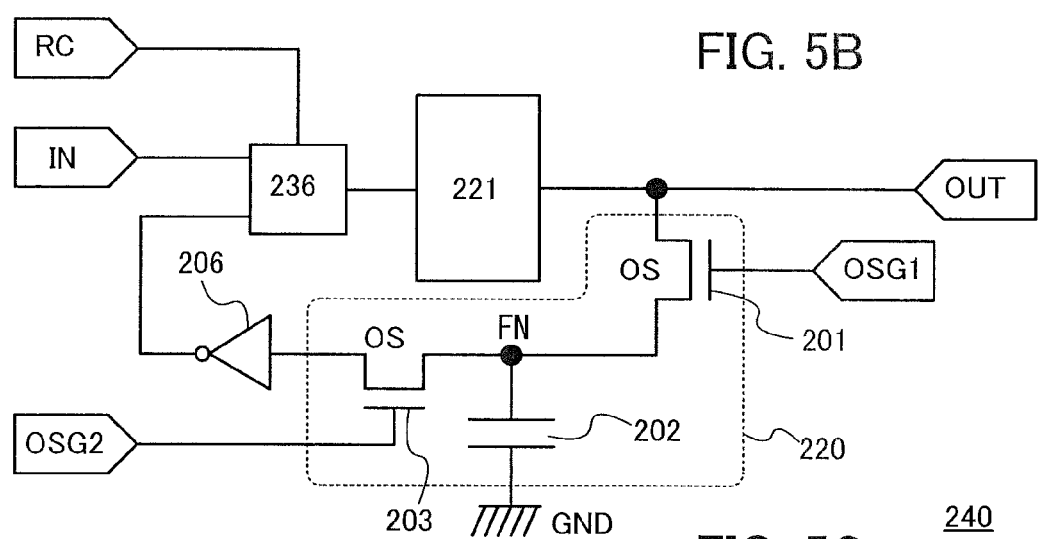

FIG. 5B illustrates a structure where the other of the source and the drain of the first transistor 201 is electrically connected to the output terminal of the memory circuit 221 and the inverter circuit 206 is provided between the other of the source and the drain of the second transistor 203 and the selection circuit 236. The other components are the same as in Embodiment 1. Note that the memory circuit 221 in FIG. 5B is configured so that a potential having a level different from that of the potential of the input signal IN input to the input terminal of the memory circuit 221 (i.e., a potential that has a low level when the input signal IN has a high-level potential and has a high level when the input signal IN has a low-level potential) is output to the output terminal as the output signal OUT. If the voltage of the output signal OUT held in the storage capacitor 202 is lowered in the power supply voltage stop period, the loss of the voltage can be compensated owing to the inverter circuit 206 at the time of outputting the signal of the node FN and a proper voltage can be output as a result. When the loss of the voltage can be compensated by providing the inverter circuit 206, the guaranteed operating range of the memory device 240 can be expanded.

Figure 5C:
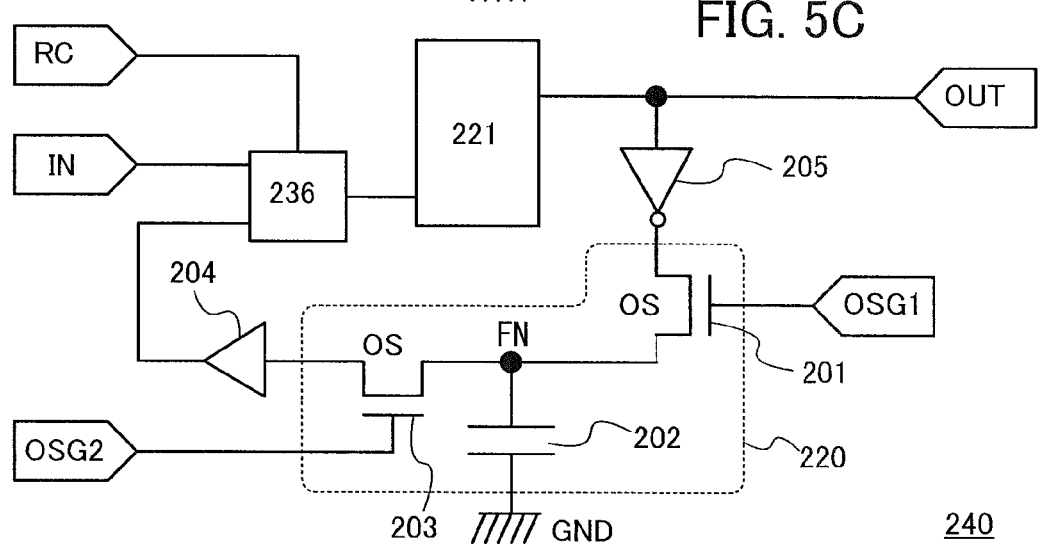

FIG. 5C illustrates a structure where the other of the source and the drain of the first transistor 201 is electrically connected to the output terminal of the memory circuit 221 through the inverter circuit 205 and the buffer circuit 204 is provided between the other of the source and the drain of the second transistor 203 and the selection circuit 236. The other components are the same as in Embodiment 1. Note that the memory circuit 221 in FIG. 5C is configured so that a potential having a level different from that of the potential of the input signal IN input to the input terminal of the memory circuit 221 (i.e., a potential that has a low level when the input signal IN has a high-level potential and has a high level when the input signal IN has a low-level potential) is output to the output terminal as the output signal OUT. If the voltage of the output signal OUT held in the storage capacitor 202 is lowered in the power supply voltage stop period, the loss of the voltage can be compensated owing to the buffer circuit 204 at the time of outputting the signal of the node FN and a proper voltage can be output as a result. When the loss of the voltage can be compensated by providing the buffer circuit 204, the guaranteed operating range of the memory device 240 can be expanded.

In a signal processing unit, a variety of circuits are connected to the memory devices 240 in various ways; thus, the amount of time that elapses before the input signal IN input to the memory device 240 becomes stable might vary among the memory devices 240. With a structure where the other of the source and the drain of the first transistor 201 is electrically connected to the input terminal of the memory circuit 221, voltages written into the storage capacitors 202 might vary when the charging time for the storage capacitors 202 is fixed. Moreover, in order to reduce variation in written voltages, the charging time needs to be set to have a margin in consideration of a variety of configurations of circuits connected to the memory devices 240. In contrast, when the other of the source and the drain of the first transistor 201 is electrically connected to the output terminal of the memory circuit 221, the memory devices 240 have the same configuration, so that variation in written potentials can be reduced. In addition, even in the memory devices 240 connected to different circuits, the charging time for the storage capacitors 202 can be fixed without consideration of circuits connected to the memory devices 240.

This embodiment can be combined with any of the other embodiments in this specification as appropriate.

Embodiment 4

In Embodiment 4, examples of the structures of a volatile latch circuit and a volatile flip-flop circuit that can be used as the memory circuit 221 in the memory device of one embodiment of the present invention will be described with reference to FIG. 6 and FIG. 7.

Figure 6:
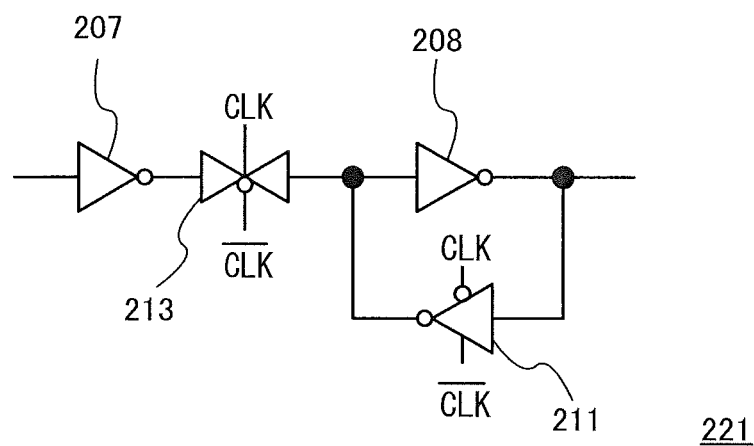
FIG. 6 is a circuit diagram illustrating the structure of a memory circuit that can be used in a memory device of an embodiment.

FIG. 6 is a circuit diagram illustrating an example of the structure of a volatile latch circuit that can be used in a semiconductor device of one embodiment of the present invention. The latch circuit is composed of an inverter circuit 207, an inverter circuit 208, a clocked inverter circuit 211, and an analog switch circuit 213. An input terminal of the inverter circuit 207 is connected to the input terminal of the memory circuit 221. An output terminal of the inverter circuit 207 is connected to an input terminal of the analog switch circuit 213. An input terminal of the inverter circuit 208 is connected to an output terminal of the analog switch circuit 213. An output terminal of the inverter circuit 208 is connected to the output terminal of the memory circuit 221. An input terminal of the clocked inverter circuit 211 is connected to the output terminal of the inverter circuit 208. An output terminal of the clocked inverter circuit 211 is connected to the input terminal of the inverter circuit 208.

Figure 7:
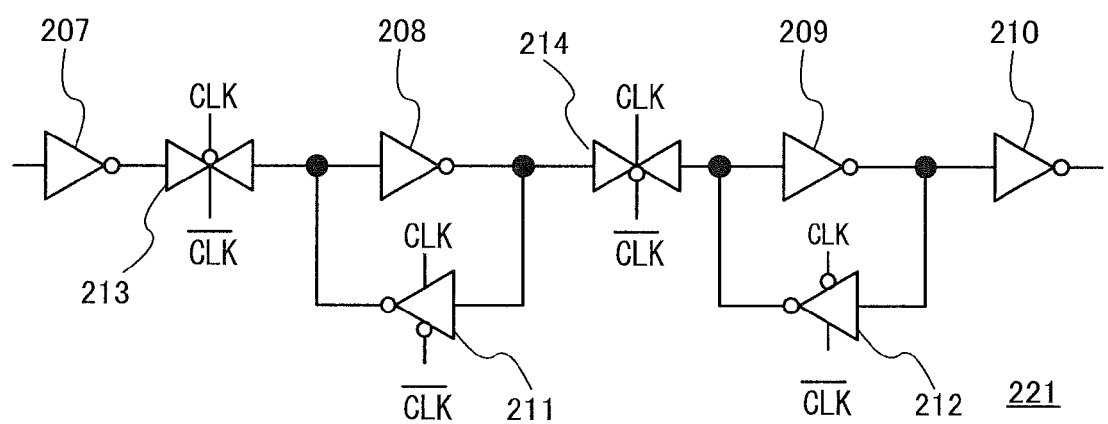
FIG. 7 is a circuit diagram illustrating the structure of a memory circuit that can be used in a memory device of an embodiment.

FIG. 7 is a circuit diagram illustrating an example of the structure of a volatile flip-flop circuit that can be used in a semiconductor device of one embodiment of the present invention. The flip-flop circuit is composed of the inverter circuit 207, the inverter circuit 208, an inverter circuit 209, an inverter circuit 210, the clocked inverter circuit 211, a clocked inverter circuit 212, the analog switch circuit 213, and an analog switch circuit 214. The input terminal of the inverter circuit 207 is connected to the input terminal of the memory circuit 221. The output terminal of the inverter circuit 207 is connected to the input terminal of the analog switch circuit 213. The input terminal of the inverter circuit 208 is connected to the output terminal of the analog switch circuit 213. The output terminal of the inverter circuit 208 is connected to an input terminal of the analog switch circuit 214. The input terminal of the clocked inverter circuit 211 is connected to the output terminal of the inverter circuit 208. The output terminal of the clocked inverter circuit 211 is connected to the input terminal of the inverter circuit 208. An input terminal of the inverter circuit 209 is connected to an output terminal of the analog switch circuit 214. An output terminal of the inverter circuit 209 is connected to an input terminal of the inverter circuit 210. An input terminal of the clocked inverter circuit 212 is connected to the output terminal of the inverter circuit 209. An output terminal of the clocked inverter circuit 212 is connected to the input terminal of the inverter circuit 209. An output terminal of the inverter circuit 210 is connected to the output terminal of the memory circuit 221.

This embodiment can be combined with any of the other embodiments in this specification as appropriate.

Embodiment 5

Embodiment 5 will explain a semiconductor applicable to a channel formation region of a transistor which can be used in a semiconductor device of one embodiment of the present invention and whose off leakage current is extremely low.

Specifically, a transistor (OS transistor) in which a channel formation region includes an oxide semiconductor described in this embodiment and the off leakage current is extremely low can be used as a transistor described in Embodiment 6.

An oxide semiconductor has a wide energy gap of 3.0 eV or more. A transistor including an oxide semiconductor layer obtained by processing of the oxide semiconductor in an appropriate condition and a sufficient reduction in carrier density of the oxide semiconductor can have much lower off leakage current between a source and a drain (off-state current) than a conventional transistor including silicon.

<Oxide Semiconductor>

An oxide semiconductor to be used preferably contains at least indium (In) or zinc (Zn). In particular, the oxide semiconductor preferably contains In and Zn. In addition, as a stabilizer for reducing variation in electrical characteristics of transistors using the oxide semiconductor, the oxide semiconductor preferably contains one or more elements selected from gallium (Ga), tin (Sn), hafnium (Hf), zirconium (Zr), titanium (Ti), scandium (Sc), yttrium (Y), and lanthanoid (e.g., cerium (Ce), neodymium (Nd), or gadolinium (Gd)).

As the oxide semiconductor, any of the following can be used, for example: indium oxide, tin oxide, zinc oxide; two-component metal oxide such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxide such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Here, an In—Ga—Zn-based oxide refers to an oxide containing In, Ga, and Zn as its main components and there is no particular limitation on the ratio of In, Ga, and Zn. The In—Ga—Zn-based oxide may contain a metal element other than In, Ga, and Zn.

Alternatively, a material represented by $InMO_3(ZnO)_m$ (m is larger than 0 and is not an integer) may be used as the oxide semiconductor. Note that M represents one or more metal elements selected from Ga, Fe, Mn, and Co, or any of the above elements as a stabilizer. Alternatively, as the oxide semiconductor, a material expressed by $In_2SnO_5(ZnO)_n$ (n is larger than 0 and is an integer) may be used.

For example, it is possible to use an In—Ga—Zn-based oxide with an atomic ratio of In:Ga:Zn=1:1:1, In:Ga:Zn=3:1:2, or In:Ga:Zn=2:1:3, or an oxide whose atomic ratio is in the neighborhood of the above compositions.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

An oxide semiconductor film may be in a non-single-crystal state, for example. The non-single-crystal state is structured, for example, by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC.

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

For example, an oxide semiconductor film may include an amorphous part. Note that an oxide semiconductor including an amorphous part is referred to as an amorphous oxide semiconductor. The amorphous oxide semiconductor film has disordered atomic arrangement and no crystal part. A typical example of the amorphous oxide semiconductor film is an oxide semiconductor film in which no crystal part exists even in a microscopic region and which is entirely amorphous.

Note that an oxide semiconductor film may be a mixed film including any of a CAAC-OS, a microcrystalline oxide semiconductor, and an amorphous oxide semiconductor. For example, the mixed film includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

<CAAC-OS Film>

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

In this specification, the term "parallel" indicates that the angle formed between two straight lines ranges from −10° to 10°, and accordingly also includes the case where the angle ranges from −5° to 5°. In addition, the term "perpendicular" indicates that the angle formed between two straight lines ranges from 80° to 100°, and accordingly includes the case where the angle ranges from 85° to 95°.

In this specification, trigonal and rhombohedral crystal systems are included in a hexagonal crystal system.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface where the CAAC-OS film is formed (also referred to as formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when a CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Moreover, when an impurity is added to the CAAC-OS film, the crystallinity in a region to which the impurity is added is changed, and the degree of crystallinity in the CAAC-OS film may vary depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

With the use of the CAAC-OS film in a transistor, variation in electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

<Method for Forming CAAC-OS Film>

There are three methods for forming a CAAC-OS film that can be used as the oxide semiconductor film.

In the first method, an oxide semiconductor film is formed at a temperature ranging from 200° C. to 450° C. to form, in the oxide semiconductor film, crystal parts in which the c-axes are aligned in the direction parallel to a normal vector of a formation surface or a normal vector of a surface of the oxide semiconductor film.

In the second method, a thin oxide semiconductor film is formed and then heated at a temperature ranging from 200° C. to 700° C. to form, in the oxide semiconductor film, crystal parts in which the c-axes are aligned in the direction parallel to a normal vector of a formation surface or a normal vector of a surface of the oxide semiconductor film.

In the third method, a first thin oxide semiconductor film is formed and then heated at a temperature ranging from 200° C. to 700° C., and a second oxide semiconductor film is subsequently formed to form, in the oxide semiconductor film, crystal parts in which the c-axes are aligned in the direction parallel to a normal vector of a formation surface or a normal vector of a surface of the oxide semiconductor film.

For example, the CAAC-OS film is formed by sputtering with a polycrystalline oxide semiconductor sputtering target. When ions collide with the sputtering target, a crystal region included in the sputtering target may be separated from the target along the a-b plane; in other words, a sputtered particle having a plane parallel to the a-b plane (flat-plate-like sputtered particle or pellet-like sputtered particle) may flake off from the sputtering target. In this case, the flat-plate-like sputtered particles reach a substrate while maintaining their crystal state, whereby the CAAC-OS film can be formed.

The CAAC-OS film is preferably deposited under the following conditions.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in a deposition chamber or by reducing the concentration of impurities in a deposition gas. Specifically, a deposition gas with a dew point of −80° C. or lower, preferably −100° C. or lower is used.

By increasing the substrate temperature during the deposition, migration of a sputtered particle occurs after the sputtered particle reaches a substrate surface. Specifically, the substrate temperature during the deposition ranges from 100° C. to 740° C., preferably from 200° C. to 500° C. By increasing the substrate temperature during the deposition, when the flat-plate-like sputtered particle reaches the substrate, migration occurs on the substrate surface; thus, a flat plane of the sputtered particle is attached to the substrate.

It is preferable that the proportion of oxygen in the deposition gas be increased and the electric power be optimized in order to reduce plasma damage in the deposition. The proportion of oxygen in the deposition gas is 30 vol % or higher, preferably 100 vol %.

As an example of the sputtering target, an In—Ga—Zn—O compound target is described below.

A polycrystalline In—Ga—Zn—O compound target is made by mixing $InO_X$ powder, $GaO_Y$ powder, and $ZnO_Z$ powder in a predetermined molar ratio, applying pressure, and performing heat treatment at a temperature of 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired sputtering target.

The above is the description of the CAAC-OS film.

<Dehydration Treatment (Dehydrogenation Treatment) and Oxygen Adding Treatment (Treatment for Making Oxygen-Excess State)>

After formation of the oxide semiconductor film, it is preferable that dehydration treatment (dehydrogenation treatment) be performed to remove hydrogen or moisture from the oxide semiconductor film so that the oxide semiconductor film is highly purified to contain as few impurities as possible, and that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making an oxygen-excess state.

In this manner, hydrogen or moisture is removed from the oxide semiconductor film by dehydration treatment (dehydrogenation treatment) and oxygen vacancies therein are filled by oxygen adding treatment, whereby the oxide semiconductor film can be turned into an i-type (intrinsic) or substantially i-type oxide semiconductor film. The oxide semiconductor film formed in such a manner includes extremely few (close to zero) carriers derived from a donor, and the carrier concentration thereof is lower than $1 \times 10^{14}/cm^3$, preferably lower than $1 \times 10^{12}/cm^3$, further preferably lower than $1 \times 10^{11}/cm^3$, still further preferably lower than $1.45 \times 10^{10}/cm^3$.

A transistor including the oxide semiconductor layer which is highly purified by sufficiently reducing the hydrogen concentration and in which defect levels in the energy gap due to oxygen vacancies are reduced by sufficiently supplying oxygen can achieve excellent off-state current characteristics. For example, the off-state current (per unit channel width (1 μm) here) at room temperature (25° C.) is 100 zA (1 zA (zeptoampere) is $1 \times 10^{-21}$ A) or less, preferably 10 zA or less. The off-state current at 85° C. is 100 zA ($1 \times 10^{-19}$ A) or less, preferably 10 zA ($1 \times 10^{-20}$ A) or less. In this manner, a transistor having excellent off-state current characteristics can be obtained with the use of an i-type (intrinsic) or substantially i-type oxide semiconductor layer.

Embodiment 6

Figure 8:
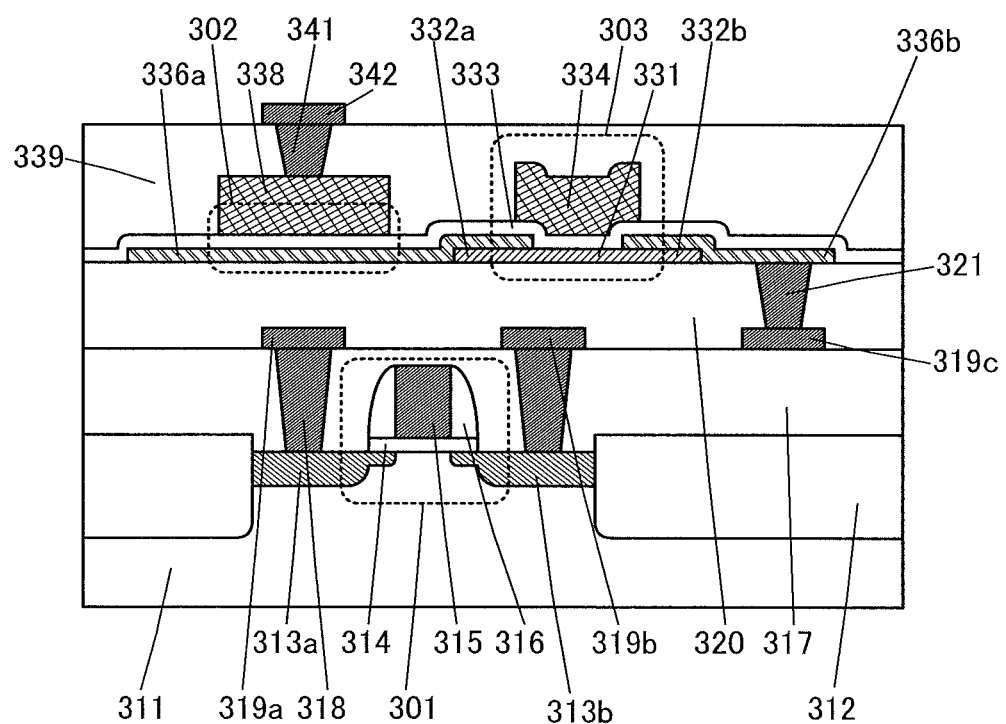
FIG. 8 illustrates the structure of a memory device of an embodiment.
Figure 9:
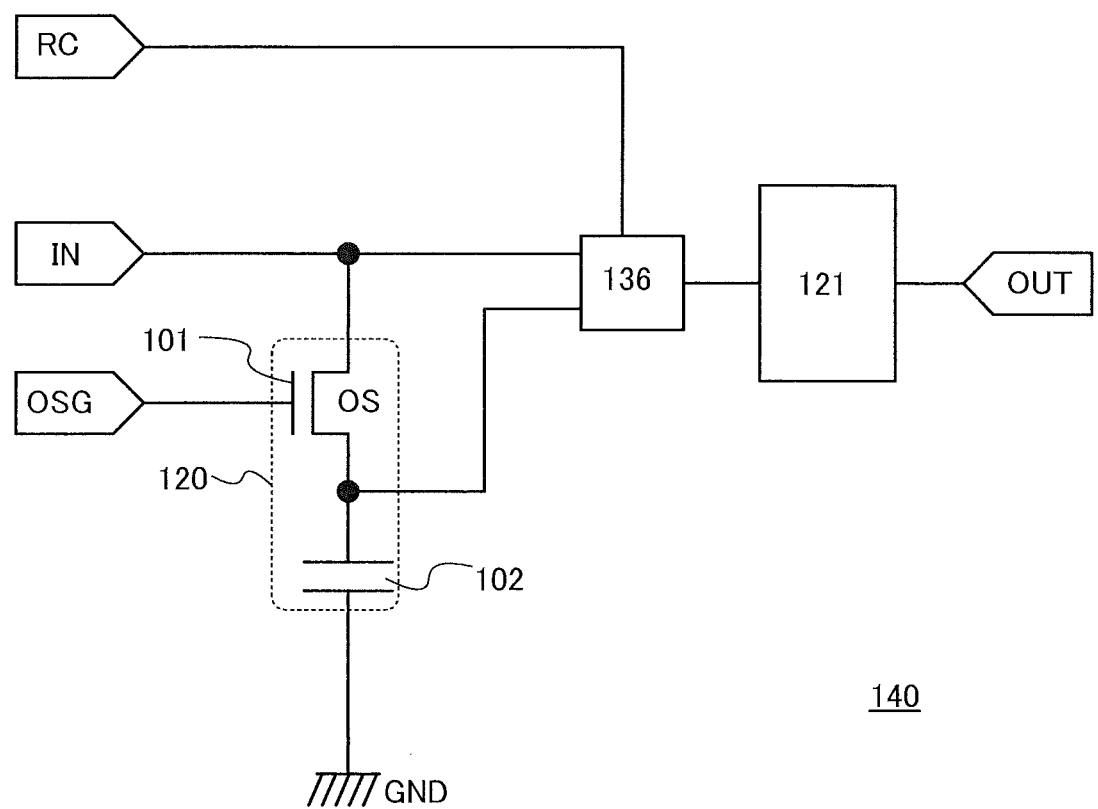
FIG. 9 is a circuit diagram of a conventional memory device.

In Embodiment 6, a structure applicable to a memory device of one embodiment of the present invention will be described with reference to FIG. 8. FIG. 8 is a cross-sectional schematic diagram illustrating the structure of a memory device of one embodiment of the present invention. Specifically, in FIG. 8, part of a memory circuit including a transistor whose off leakage current is extremely low and a capacitor is provided above part of another circuit that is formed through a CMOS process.

Note that the transistor whose off leakage current is extremely low includes the semiconductor described in Embodiment 5 in a region where a channel is formed.

In the memory device illustrated in FIG. 8, part of the memory circuit 220 including a transistor 303 whose off leakage current is extremely low and a capacitor 302 is provided above the selection circuit 236 or the memory circuit 221 which includes a transistor 301 formed through a CMOS process. Specifically, the memory device includes the transistor 301 including a semiconductor layer containing a semiconductor belonging to Group 14 of the periodic table (e.g., silicon), the transistor 303 including an oxide semiconductor layer in which a channel is formed, and the capacitor 302. More specifically, the memory device includes a semiconductor layer 311, an insulating layer 314, a conductive layer 315, an insulating layer 316, an insulating layer 317, a connection layer 318, a conductive layer 319a, a conductive layer 319b, a conductive layer 319c, an insulating layer 320, a connection layer 321, a semiconductor layer 331, an insulating layer 333, a conductive layer 334, a conductive layer 336a, a conductive layer 336b, a conductive layer 338, an insulating layer 339, a connection layer 341, and a conductive layer 342.

Such a structure allows the transistor 303 and the capacitor 302 to be formed to overlap with another circuit (e.g., the memory circuit 221 or the selection circuit 236), thereby preventing an increase in the area of the memory device.

The following describes individual components included in a semiconductor device of one embodiment of the present invention.

<Layer Including Transistor Formed Through CMOS Process>

The semiconductor layer 311 includes a region 313a and a region 313b. Adjacent transistors are electrically isolated by insulating layers 312 provided in some regions of the semiconductor layer 311.

For example, a semiconductor substrate can be used as the semiconductor layer 311. Alternatively, a semiconductor layer over a different substrate can be used as the semiconductor layer 311.

The region 313a and the region 313b are spaced apart from each other, and a dopant imparting n-type or p-type conductivity is added to the regions 313a and 313b. The region 313a and the region 313b function as a source region and a drain region of the transistor 301. The region 313a and the region 313b are electrically connected to the conductive layer 319a and the conductive layer 319b, respectively, through the connection layers 318.

When the transistor 301 is an n-channel transistor, an element imparting n-type conductivity is used as the dopant. In contrast, when the transistor 301 is a p-channel transistor, an element imparting p-type conductivity is used as the dopant.

Note that low-concentration regions may be provided in parts of the regions 313a and 313b. In this case, the low-concentration regions may be shallower than the rest of the regions 313a and 313b; however, this embodiment is not limited to this.

The insulating layer 314 is provided over a region of the semiconductor layer 311 that is between the insulating layers 312. The insulating layer 314 functions as a gate insulating layer of the transistor 301.

The insulating layer 314 can be a layer of silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic), for example. The insulating layer 314 may be formed by stacking materials that can be used for the insulating layer 314.

The conductive layer 315 overlaps with the semiconductor layer 311 with the insulating layer 314 placed therebetween. A region of the semiconductor layer 311 that overlaps with the conductive layer 315 is a channel formation region of the transistor 301. The conductive layer 315 functions as a gate of the transistor 301.

The conductive layer 315 can be a layer of a metal material such as molybdenum, magnesium, titanium, chromium, tantalum, tungsten, aluminum, copper, neodymium, or scandium or an alloy material containing the metal material as a main component, for example. The conductive layer 315 may be formed by stacking materials that can be used for the conductive layer 315.

The insulating layers 316 are provided over the insulating layer 314 and in contact with a pair of side surfaces of the conductive layer 315 that face each other.

The insulating layer 317 is provided over the conductive layer 315 and the insulating layers 316.

Each of the insulating layers 316 and 317 can be formed using any of the materials that can be used for the insulating layer 314, which may be the same as or different from the material used for the insulating layer 314. Alternatively, the insulating layers 316 or the insulating layer 317 can be formed by stacking materials that can be used for the insulating layers 316 and 317.

The connection layers 318 are provided to fill openings in the insulating layer 317 and are electrically connected to the region 313a and the region 313b.

The conductive layers 319a, 319b, and 319c are provided over the insulating layer 317. The conductive layer 319a is electrically connected to the region 313a through the connection layer 318. The conductive layer 319b is electrically connected to the region 313b through the connection layer 318. The conductive layer 319c is electrically connected to the conductive layer 315 through the connection layer 318 (not illustrated).

The connection layer 318 and the conductive layers 319a, 319b, and 319c can be formed using any of the materials that can be used for the conductive layer 315, which may be the same as or different from the material used for the conductive layer 315. Alternatively, the connection layer 318 and the conductive layers 319a, 319b, and 319c can be formed by stacking materials that can be used for the connection layer 318 and the conductive layers 319a, 319b, and 319c.

The insulating layer 320 is provided over the insulating layer 317 and the conductive layers 319a, 319b, and 319c. The structure of the insulating layer 320 can be similar to that of the insulating layer 317.

The connection layer 321 is provided to fill an opening in the insulating layer 320 and is electrically connected to the conductive layer 319c. The structure of the connection layer 321 can be similar to that of the connection layer 318.

<Layer Including Transistor with Very Low Off Leakage Current and Capacitor>

The semiconductor layer 331 is provided over the insulating layer 320. For the semiconductor layer 331, the semiconductor described in Embodiment 5 can be used.

A region to which a dopant is added may be provided in regions of the semiconductor layer 331 that overlap with the conductive layers 336a and 336b. The dopant can be one or more elements selected from a Group 15 element (typically, nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn). Note that such a region is not necessarily provided.

The conductive layer 336a and the conductive layer 336b are spaced apart from each other and electrically connected to the semiconductor layer 331. The conductive layer 336a and the conductive layer 336b function as a source electrode and drain electrode of the transistor 303. The conductive layer 336b is electrically connected to the connection layer 321. The conductive layer 336a also functions as one of electrodes of the capacitor 302.

The conductive layers 336a and 336b can be formed using a metal such as aluminum (Al), chromium (Cr), copper (Cu), tantalum (Ta), titanium (Ti), molybdenum (Mo), tungsten (W), neodymium (Nd), or scandium (Sc); an alloy containing the above metal element; an alloy containing the above metal elements in combination; a nitride of the above metal element; or the like. Further, a metal element such as manganese (Mn), magnesium (Mg), zirconium (Zr), or beryllium (Be) may be used.

The insulating layer 333 can be provided over the semiconductor layer 331 and the conductive layers 336a and 336b. The insulating layer 333 functions as a gate insulating layer of the transistor 303. The insulating layer 333 also functions as a dielectric layer of the capacitor 302.

The insulating layer 333 can be formed using a single layer or a stacked layer using a material selected from aluminum nitride, aluminum oxide, aluminum nitride oxide, aluminum oxynitride, silicon nitride, silicon oxide, silicon nitride oxide, silicon oxynitride, tantalum oxide, or lanthanum oxide, for example.

When a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide is used for the insulating layer 333, gate leakage can be reduced by increasing the physical thickness of the gate insulating film without changing the substantial thickness (e.g., equivalent oxide thickness) of the gate insulating film. Further, the insulating layer 333 can have a stacked structure in which a high-k material and one or more of silicon oxide, silicon oxynitride, silicon nitride, silicon nitride oxide, aluminum oxide, aluminum oxynitride, and gallium oxide are stacked.

The conductive layer 334 overlaps with the semiconductor layer 331 with the insulating layer 333 placed therebetween. The conductive layer 334 functions as a gate of the transistor 303. It is preferable that part of the conductive layer 334 overlap with the conductive layers 336a and 336b.

The conductive layer 334 can be formed using a metal selected from aluminum (Al), chromium (Cr), copper (Cu), tantalum (Ta), titanium (Ti), molybdenum (Mo), tungsten (W), neodymium (Nd), or scandium (Sc); an alloy containing the above metal element; an alloy containing the above metal elements in combination; a nitride of the above metal element; or the like. Further, a metal element such as manganese (Mn), magnesium (Mg), zirconium (Zr), or beryllium (Be) may be used.

The conductive layer 334 may have a single-layer structure or a stacked structure of two or more layers. For example, the conductive layer 334 may have a single-layer structure using aluminum containing silicon, a two-layer structure in which titanium is stacked over aluminum or titanium nitride, a two-layer structure in which tungsten is stacked over titanium nitride or tantalum nitride, a two-layer structure in which Cu is stacked over a Cu—Mg—Al alloy, or a three-layer structure in which titanium, aluminum, and titanium are stacked in this order.

Alternatively, the conductive layer 334 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, the conductive layer 334 can have a stacked structure using the light-transmitting conductive material and the above metal element.

Gallium oxide, indium gallium zinc oxide containing nitrogen, indium tin oxide containing nitrogen, indium gallium oxide containing nitrogen, indium zinc oxide containing nitrogen, tin oxide containing nitrogen, indium oxide containing nitrogen, or a metal nitride (e.g., InN or ZnN) may overlap with the conductive layer 334 and the semiconductor layer 331 and be in contact with the conductive layer 334 and the insulating layer 333.

These materials each have a work function of 5 eV or more, preferably 5.5 eV or more. When a layer formed using any of these materials overlaps with the semiconductor layer 331 with the insulating layer 333 placed therebetween, the threshold voltage of the transistor 303 can be positive and a normally-off switching element is obtained as a result. For example, when In—Ga—Zn—O containing nitrogen is used, In—Ga—Zn—O having a higher nitrogen concentration than at least the semiconductor layer 331, specifically, In—Ga—Zn—O having a nitrogen concentration of 7 at. % or higher is used.

The conductive layer 338 is provided over the conductive layer 336a with the insulating layer 333 placed therebetween.

Here, the capacitor 302 consists of the conductive layer 336a, the insulating layer 333, and the conductive layer 338.

The insulating layer 339 is provided over the insulating layer 333 and the conductive layers 334 and 338.

The insulating layer 339 can be formed using a material similar to that used for the insulating layer 317.

The connection layer 341 is provided to fill an opening in the insulating layer 339 and is electrically connected to the conductive layer 338.

The structure of the connection layer 341 can be similar to that of the connection layer 318.

The conductive layer 342 is provided over the insulating layer 339. The conductive layer 342 is electrically connected to the conductive layer 338 through the connection layer 341.

The structure of the conductive layer 342 can be similar to those of the conductive layers 319a, 319b, and 319c.

Although the transistor with very low off leakage current has a top-gate structure in FIG. 8, the transistor may have a bottom-gate structure. In addition, although the transistor in FIG. 8 has a top-contact structure where the conductive layers are provided over the semiconductor layer, the transistor may have a bottom-contact structure where a semiconductor layer is provided over conductive layers.

This embodiment can be combined with any of the other embodiments in this specification as appropriate.

This application is based on Japanese Patent Application serial no. 2013-051966 filed with Japan Patent Office on Mar. 14, 2013, the entire contents of which are hereby incorporated by reference.

What is claimed is:

1. A memory device comprising:
a first transistor, a second transistor, a storage capacitor, a selection circuit, and a memory circuit,
wherein a first signal is to be input to a first input terminal of the selection circuit input
wherein an output terminal of the selection circuit is electrically connected to an input terminal of the memory circuit,
wherein one of a source and a drain of the first transistor is electrically connected to an output terminal of the memory circuit,
wherein the other of the source and the drain of the first transistor is electrically connected to one of terminals of the storage capacitor and one of a source and a drain of the second transistor,
wherein the other of the source and the drain of the second transistor is electrically connected to a second input terminal of the selection circuit,
wherein the first transistor includes an oxide semiconductor layer that includes a channel formation region,
wherein the second transistor includes an oxide semiconductor layer that includes a channel formation region,
wherein a second signal originating from the output terminal of the memory circuit is to be input to the second input terminal of the selection circuit through the first transistors and the second transistor, and
wherein the selection circuit is configured to select the first signal or the second signal and is configured to output the selected signal to the input terminal of the memory circuit.

2. The memory device according to claim 1, further comprising a buffer circuit, wherein the other of the source and the drain of the second transistor is electrically connected to the second input terminal of the selection circuit through the buffer circuit.

3. The memory device according to claim 1, further comprising a first inverter circuit and a second inverter circuit,
wherein one of the source and the drain of the second transistor is electrically connected to the output terminal of the memory circuit through the first inverter circuit, and
wherein the other of the source and the drain of the second transistor is electrically connected to the second input terminal of the selection circuit through the second inverter circuit.

4. The memory device according to claim 1, wherein the oxide semiconductor layer of the second transistor includes an In—Ga—Zn-based oxide.

5. The memory device according to claim 1, wherein the oxide semiconductor layer of the second transistor includes crystal parts in which c-axes are aligned in a direction parallel to a normal vector of a surface of the oxide semiconductor layer of the second transistor.

6. The memory device according to claim 1, wherein an off-state current per a channel width of 1 μm in the second transistor at 25° C. is 100 zA or less.

7. The memory device according to claim 1, wherein the memory circuit is a latch circuit.

8. The memory device according to claim 1, wherein the memory circuit is a flip-flop circuit.

9. The memory device according to claim 1,
wherein the memory circuit includes a third transistor,
wherein the selection circuit includes a fourth transistor, and
wherein a channel formation region of each of the third transistor and the fourth transistor includes any one of Si, Ge, SiC, GaAs, and GaP.

10. The memory device according to claim 1, wherein the first transistor and the second transistor are over the selection circuit or the memory circuit.

11. The memory device according to claim 1,
wherein the storage capacitor is configured to hold the first signal when application of power supply voltage to the memory circuit is stopped, and
wherein the held first signal in the storage capacitor is to be input to the memory circuit through the selection circuit after application of the power supply voltage is resumed.

12. A memory device comprising:
a first transistor, a second transistor, a storage capacitor, a selection circuit, and a memory circuit,
wherein a first signal is to be input to a first input terminal of the selection circuit input
wherein an output terminal of the selection circuit is electrically connected to an input terminal of the memory circuit,
wherein one of a source and a drain of the first transistor is electrically connected to an output terminal of the memory circuit,
wherein the other of the source and the drain of the first transistor is electrically connected to one of terminals of the storage capacitor and one of a source and a drain of the second transistor,
wherein the other of the source and the drain of the second transistor is electrically connected to a second input terminal of the selection circuit,
wherein the first transistor includes an oxide semiconductor layer that includes a channel formation region,
wherein the second transistor includes an oxide semiconductor layer that includes a channel formation region,
wherein the selection circuit includes a third transistor, and
wherein a channel formation region of the third transistor includes any one of Si, Ge, SiC, GaAs, and GaP,
wherein a second signal originating from the output terminal of the memory circuit is to be input to the second input terminal of the selection circuit through the first transistors and the second transistor, and
wherein the selection circuit is configured to select the first signal or the second signal and is configured to output the selected signal to the input terminal of the memory circuit.

13. The memory device according to claim 12, further comprising a buffer circuit, wherein the other of the source and the drain of the second transistor is electrically connected to the second input terminal of the selection circuit through the buffer circuit.

14. The memory device according to claim 12, further comprising a first inverter circuit and a second inverter circuit,
wherein one of the source and the drain of the second transistor is electrically connected to the output terminal of the memory circuit through the first inverter circuit, and
wherein the other of the source and the drain of the second transistor is electrically connected to the second input terminal of the selection circuit through the second inverter circuit.

15. The memory device according to claim 12, wherein the oxide semiconductor layer of the second transistor includes an In—Ga—Zn-based oxide.

16. The memory device according to claim 12, wherein the oxide semiconductor layer of the second transistor includes crystal parts in which c-axes are aligned in a direction parallel to a normal vector of a surface of the oxide semiconductor layer of the second transistor.

17. The memory device according to claim 12, wherein an off-state current per a channel width of 1 μm in the second transistor at 25° C. is 100 zA or less.

18. The memory device according to claim 12, wherein the memory circuit is a latch circuit.

19. The memory device according to claim 12, wherein the memory circuit is a flip-flop circuit.

20. The memory device according to claim 12, wherein the first transistor and the second transistor are over the selection circuit or the memory circuit.

21. The memory device according to claim 12,
   wherein the storage capacitor is configured to hold the first signal when application of power supply voltage to the memory circuit is stopped, and
   wherein the held first signal in the storage capacitor is to be input to the memory circuit through the selection circuit after application of the power supply voltage is resumed.

* * * * *